United States Patent
Hasegawa et al.

(10) Patent No.: US 6,178,071 B1
(45) Date of Patent: Jan. 23, 2001

(54) SPIN-VALVE TYPE THIN FILM ELEMENT AND ITS MANUFACTURING METHOD

(75) Inventors: Naoya Hasegawa; Toshihiro Kuriyama, both of Niigata-ken (JP)

(73) Assignee: Alps Electric Co., Ltd., Tokyo (JP)

(*) Notice: Under 35 U.S.C. 154(b), the term of this patent shall be extended for 0 days.

(21) Appl. No.: 09/158,447

(22) Filed: Sep. 22, 1998

(30) Foreign Application Priority Data

Sep. 24, 1997 (JP) .................................................. 9-258718

(51) Int. Cl.[7] .............................................. G11B 5/39
(52) U.S. Cl. .................................................. 360/324.11
(58) Field of Search ........................ 360/324.1, 324.11; 324/252, 207.21; 338/32 R

(56) References Cited

U.S. PATENT DOCUMENTS

| | | | |
|---|---|---|---|
| 5,287,238 | * 2/1994 | Baumgart et al. | 360/113 |
| 5,701,222 | * 12/1997 | Gill et al. | 360/113 |
| 5,880,913 | * 3/1999 | Gill | 360/113 |
| 6,084,405 | * 7/2000 | Suzuki | 324/252 |

FOREIGN PATENT DOCUMENTS 11-175923 * 7/1999 (JP).

* cited by examiner

Primary Examiner—William J. Klimowicz
(74) Attorney, Agent, or Firm—Brinks Hofer Gilson & Lione

(57) ABSTRACT

A spin-valve type thin film element includes an antiferromagnetic layer, a pinned magnetic layer, a free magnetic layer, a non-magnetic electrically conductive layer, a bias layer, and an electrically conductive layer. The magnetization direction of the pinned magnetic layer in the end regions in relation to the track width is fixed in the direction of the leakage magnetic field from a recording medium, and the magnetization direction of the pinned magnetic layer in the central region is fixed in the direction inclined in relation to the direction of the leakage magnetic field from the recording medium. A method for manufacturing a spin-valve type thin film element includes the steps of forming a multi-layered film, magnetic annealing at a temperature T1, patterning the multi-layered film into a predetermined shape, forming a bias layer on both sides of the multi-layered film, magnetizing the bias layer, annealing without applying a magnetic field at a temperature T2, and magnetizing the bias layer.

8 Claims, 8 Drawing Sheets

SPIN-VALVE TYPE THIN FILM ELEMENT AND ITS MANUFACTURING METHOD

BACKGROUND OF THE INVENTION

1. Field of the Invention

The present invention relates to a spin-valve type thin film element in which electrical resistance changes in response to the relationship between the magnetization direction of a pinned magnetic layer and the magnetization direction of a free magnetic layer which is influenced by an external magnetic field. More particularly, the invention relates to a spin-valve type thin film element in which a relative angle between the magnetization of a pinned magnetic layer and the magnetization of a free magnetic layer can be properly adjusted.

2. Description of the Related Art

FIG. 7 is a sectional view of a spin-valve type thin film element (spin-valve type thin film magnetic head) which detects a recording magnetic field from a recording medium such as a hard disk drive.

This spin-valve type thin film element includes an antiferromagnetic layer 10, a pinned magnetic layer 11, a non-magnetic electrically conductive layer 12, and a free magnetic layer 13 deposited in that order, and hard magnetic bias layers 5 and 5 formed on both sides thereof.

Generally, a nickel—manganese (Ni—Mn) alloy film is used for the antiferromagnetic layer 10, a nickel—iron (Ni—Fe) alloy film is used for the pinned magnetic layer 11 and the free magnetic layer 13, a copper (Cu) film is used for the non-magnetic electrically conductive layer 12, and a cobalt—platinum (Co—Pt) alloy film or the like is used for the hard magnetic bias layers 5 and 5. Numerals 6 and 7 represent an under layer and a protective layer, respectively, composed of a non-magnetic material such as tantalum (Ta).

As shown in the drawing, the antiferromagnetic layer 10 and the pinned magnetic layer 11 are formed in contact with each other, the pinned magnetic layer 11 is put into a single domain state in the Y direction by an exchange anisotropic magnetic field caused by exchange coupling at the interface between the pinned magnetic layer 11 and the antiferromagnetic layer 10, and the magnetization direction is fixed in the Y direction. The exchange anisotropic magnetic field occurs at the interface between the antiferromagnetic layer 10 and the pinned magnetic layer 11 by film deposition or annealing while applying the magnetic field in the Y direction.

Also, the magnetization direction of the free magnetic layer 13 is aligned in the X direction under the influence of the hard magnetic bias layers 5 and 5 which are magnetized in the X direction.

In the spin-valve type thin film element, a sensing current is applied from electrically conductive layers 8 and 8 formed on the hard magnetic bias layers 5 and 5 into the pinned magnetic layer 11, the non-magnetic electrically conductive layer 12, and the free magnetic layer 13. The driving direction of a recording medium such as a hard disk drive is in the Z direction, and if a leakage magnetic field from the recording medium is applied in the Y direction, the magnetization of the free magnetic layer 13 changes from the X direction to the Y direction. Because of the relationship between the change in the magnetization direction in the free magnetic layer 13 and the pinned magnetization direction of the pinned magnetic layer 11, the electrical resistance changes, and the leakage magnetic field from the recording medium is detected by the voltage change based on the change in the electrical resistance.

Although the hard magnetic bias layers 5 and 5 are formed to put the free magnetic layer 13 into a single domain state and align the magnetization in the X direction shown in the drawing, the magnetization of the free magnetic layer 13 is not always aligned in the X direction in the entire region when a sensing current is applied.

Japanese Patent Publication No. 9-92907 (page 2, column 2, line 14) describes that "in the magnetoresistive element, the first ferromagnetic layer 21 is subjected to a magnetic field caused by static magnetic coupling with the second ferromagnetic layer 23, a magnetic field caused by exchange coupling between layers, and an electric current magnetic field." The "first ferromagnetic layer 21" corresponds to the free magnetic layer 13 shown in FIG. 7, and the "second ferromagnetic layer 23" corresponds to the pinned magnetic layer 11 shown in FIG. 7.

The above Patent Publication also has the following description (page 2, column 2, line 23). "However, each magnetic field essentially has a different distribution of height directions, and thus, complete offset cannot be performed. For example, FIG. 3A is a graphic representation showing the distribution of height directions with respect to the static magnetic field caused by static magnetic coupling, the electric current magnetic field and the magnetization in the first ferromagnetic layer. As is clear from the drawing, since the static magnetic field caused by static magnetic coupling and the electric current magnetic field are properties oriented in the same direction in relation to the vertical axis, the two magnetic fields cannot be offset uniformly, the height component of the magnetization of the first ferromagnetic layer crosses zero at both ends in the height direction. Thereby, magnetic domain walls are produced, which may lead to Barkhausen noise."

That is, as shown in FIG. 9, even when the static magnetic field caused by static magnetic coupling and the electric current magnetic field caused by a sensing current are offset with respect to the magnetization C2 in the central region in the Y direction (height direction) in the free magnetic layer 13, magnetizations C1 and C3 in end regions in the Y direction are inclined in relation to the X direction.

As described above, the free magnetic layer 13 has a distribution of different magnetization directions in relation to the Y direction under the influence of the static magnetic field caused by static magnetic coupling and the electric current magnetic field caused by a sensing current.

Therefore, as shown in FIG. 9, the relative angle between magnetizations C1 and C3 of the free magnetic layer 13 and the magnetization D of the pinned magnetic layer 11 is not set at 90°, and thus, asymmetry deteriorates. The word "asymmetry" means the vertical asymmetry of the regenerated output waveform.

In Japanese Patent Publication No. 9-92907, an attempt is made to set at 90° the relative angle between the magnetization of the first ferromagnetic layer (free magnetic layer) and the magnetization of the second ferromagnetic layer (pinned magnetic layer), as described in the following (page 3, column 3, line 17). "FIG. 3B shows the distribution of height directions with respect to the static magnetic field caused by static magnetic coupling, the electric current magnetic field and the magnetization in the first ferromagnetic layer 1. In this distribution, the static magnetic field caused by static magnetic coupling and the electric current magnetic field are properties standing opposed to each other in relation to the vertical axis. Also, since the magnetization of the first ferromagnetic layer 1 is directed at 45° in relation to the direction of the applied magnetic field, the magnetic fields are added, and thus, the first ferromagnetic layer 1 has substantially uniform height components of the magnetization in relation to the height direction."

That is, as shown in FIG. 10, the magnetization D of the second ferromagnetic layer (pinned magnetic layer 11) is fixed, being inclined by θ2 (=45°) in relation to the Y direction, and because of static magnetic coupling with the pinned magnetic layer 11, the magnetization C2 of the first ferromagnetic layer (free magnetic layer 13) is inclined by θ2 (=45°). The relative angle between magnetizations C1, C2, and C3 of the free magnetic layer and the magnetization D of the pinned magnetic layer is adjusted to 90°, and thus, the static magnetic field and the electric current magnetic field are offset.

Japanese Patent Publication No. 9-92907 aims to overcome the problem of asymmetry by the method described above.

However, it has been confirmed that the magnetization of the free magnetic layer 13 in the central region has a different direction from that in end regions in relation to the track width direction (X direction). The magnetization state is shown in FIG. 8.

As shown in FIG. 8, magnetizations A and B in end regions of the free magnetic layer 13 are easily aligned in the X direction. The reason is that the end regions of the free magnetic layer abut on hard magnetic bias layers 5 and 5, and are strongly influenced by the bias magnetic field of the hard magnetic bias layers 5 and 5 in the X direction.

In accordance with Japanese Patent Publication No. 9-92907, although the relative angle between magnetizations C1, C2, and C3 in the central region of the free magnetic layer 13 and the magnetization D2 of the pinned magnetic layer 11 can be set at 90° or its approximation, since magnetizations D1, D2, and D3 of the pinned magnetic layer 11 are fixed so as to be inclined in relation to the Y direction, the relative angle between magnetizations A and B in end regions of the free magnetic layer 13 and magnetizations D1 and D3 of the pinned magnetic layer 11 cannot be set at 90°, resulting in the deterioration of asymmetry in the end regions.

The deterioration of asymmetry in the end regions makes it difficult to detect the track position accurately, and easily leads to a servo error.

SUMMARY OF THE INVENTION

The present invention overcomes the problems noted above with respect to the related art. It is an object of the present invention to provide a spin-valve type thin film element in which, in the presence of an applied sensing current, magnetizations in end regions and the central region of a pinned magnetic layer are properly aligned so that the relative angle between the magnetization of a free magnetic layer and the magnetization of the pinned magnetic layer in the entire region is set at 90°, and thus, satisfactory asymmetry can be obtained.

In accordance with the present invention, a spin-valve type thin film element includes an antiferromagnetic layer; a pinned magnetic layer formed in contact with the antiferromagnetic layer, the magnetization direction of the pinned magnetic layer being fixed by the exchange anisotropic magnetic field between the pinned magnetic layer and the antiferromagnetic layer; a free magnetic layer formed over and/or under the pinned magnetic layer with a non-magnetic electrically conductive layer therebetween; a bias layer for aligning the magnetization direction of the free magnetic layer in the direction perpendicular to the magnetization direction of the pinned magnetic layer; and an electrically conductive layer for applying a sensing current into the pinned magnetic layer, the non-magnetic electrically conductive layer, and the free magnetic layer. The magnetization direction of the pinned magnetic layer in the end regions in relation to the track width is fixed in the direction of the leakage magnetic field from a recording medium, and the magnetization of the pinned magnetic layer in the central region is fixed in the direction of the leakage magnetic field from a recording medium, and the magnetization of the pinned magnetic layer in the central region is fixed in the direction inclined in relation to the direction of the leakage magnetic field from the recording medium.

In accordance with the present invention, the magnetization direction of the pinned magnetic layer in the central region is set perpendicular to the magnetization of the free magnetic layer in the central region when a sensing current is applied.

Also, in accordance with the present invention, preferably the antiferromagnetic layer is composed of an antiferromagnetic material having a composition of $X_a Mn_{100-a}$, where X is at least one element selected from the group consisting of Pd, Pt, Ru, and Ir, and the atomic percent "a" satisfies $40 \leq a \leq 60$.

In particular, in accordance with the present invention, among the X—Mn alloys, a Pt—Mn alloy is more preferably used for the antiferromagnetic layer.

The Pt—Mn alloy produces a larger exchange anisotropic magnetic field in comparison with the Ni—Mn alloy or the like that has been conventionally used for the antiferromagnetic layer, and has a high blocking temperature, and also has high corrosion resistance. These are excellent characteristics as the antiferromagnetic material.

Also, in accordance with the present invention, the antiferromagnetic layer may be composed of a Pt—Mn—X' alloy, where X' is at least one element selected from the group consisting of Ni, Pd, Rh, Ru, Ir, Cr, and Co.

Also, in accordance with the present invention, a method for making a spin-valve type thin film element includes the following steps, the spin-valve type thin film element having an antiferromagnetic layer, a pinned magnetic layer formed in contact with the antiferromagnetic layer, the magnetization direction of the pinned magnetic layer being fixed by the exchange anisotropic magnetic field between the pinned magnetic layer and the antiferromagnetic layer, a free magnetic layer formed on the pinned magnetic layer with a non-magnetic electrically conductive layer therebetween, a bias layer for aligning the magnetization direction of the free magnetic layer in the direction perpendicular to the magnetization direction of the pinned magnetic layer, and an electrically conductive layer for applying a sensing current into the pinned magnetic layer, the non-magnetic electrically conductive layer, and the free magnetic layer:

a step of forming a multi-layered film by depositing the antiferromagnetic layer, the pinned magnetic layer, the non-magnetic electrically conductive layer, and the free magnetic layer, in that order;

a step of magnetic annealing at a temperature T1 so that the magnetization of the pinned magnetic layer is adjusted to the direction inclined in relation to the direction of the leakage magnetic field from a recording medium;

a step of patterning the multi-layered film into a predetermined shape, and forming a bias layer on both sides of the multi-layered film, the bias layer having a coercive force that enables a permanent magnet;

a step of magnetizing the bias layer in the same direction as that of the leakage magnetic field from the recording medium at a lower temperature than the temperature T1;

a step of annealing without applying a magnetic field at a temperature T2 so that the magnetization of the pinned magnetic layer in the end regions in relation to the track width is adjusted to the same direction as that of the leakage magnetic field from the recording medium; and a step of magnetizing the bias layer in the direction perpendicular to the direction of the leakage magnetic field from the recording medium at a lower temperature than the temperature T2.

In accordance with the present invention, the multi-layered film may be formed by depositing the free magnetic layer, the non-magnetic electrically conductive layer, the pinned magnetic layer, and the antiferromagnetic layer, in that order. Alternatively, the multi-layered film may be formed by depositing the antiferromagnetic layer, the pinned magnetic layer, the non-magnetic electrically conductive layer, the free magnetic layer, the non-magnetic electrically conductive layer, the pinned magnetic layer and the antiferromagnetic layer, in that order from the bottom.

Also, the antiferromagnetic layer is preferably composed of an X—Mn alloy (where X is at least one element selected from the group consisting of Pd, Pt, Ru, and Ir), and more preferably composed of a Pt—Mn alloy. As described above, preferably, the composition of X ranges from 40 to 60 atomic percent, and the balance corresponds to the composition of Mn.

Also, the antiferromagnetic layer may be composed of a Pt—Mn—X' alloy (where X' is at least one element selected from the group consisting of Ni, Pd, Rh, Ru, Ir, Cr, and Co).

Also, in accordance with the present invention, the temperature T1 preferably ranges from 200° C. to 260° C., the temperature T2 preferably ranges from 210° C. to 270° C., and, in particular, the temperature T2 is preferably set higher than the temperature T1.

In accordance with the present invention, the magnetization direction of the pinned magnetic layer is properly adjusted in response to the magnetization direction of the free magnetic direction.

Generally, the magnetization of the free magnetic layer is aligned in the track width direction under the influence of the bias layer while a sensing current is applied, however, in reality, in the presence of the applied sensing current, the magnetization in the end regions of the free magnetic layer is aligned in the track width direction and the magnetization in the central region of the free magnetic layer is distributed differently in relation to the height direction. The different directional distribution of the magnetization in the central region is caused by the magnetic field from the sensing current, the static magnetic field between the free magnetic layer and the pinned magnetic layer, and the like.

In accordance with Japanese Patent Publication No. 9-92907, by inclining the magnetization of the pinned magnetic layer (second ferromagnetic layer), the relative angle between the magnetization of the pinned magnetic layer and the magnetization of the free magnetic layer (first ferromagnetic layer) in the central region can be set at 90° or its approximation, however, the relative angle between the magnetization of the pinned magnetic layer and the magnetization of the free magnetic layer in the end regions cannot be set at 90°, resulting in the deterioration of asymmetry.

In accordance with the present invention, as shown in FIG. 1, by inclining the magnetization G in the central region of the pinned magnetic layer 2 in relation to the Y1 direction (direction of the leakage magnetic field from the recording medium), the relative angle between the magnetization C2 of the free magnetic layer 4 and the magnetization G of the pinned magnetic layer 2 is set at 90° or its approximation by the static magnetic field caused by static magnetic coupling, and thus, the relative angle between magnetizations C1, C2, and C3 in the entire central region of the free magnetic layer 4 and the magnetization G of the pinned magnetic layer 2 can be set at 90° or its approximation.

Also, since magnetizations A and B in the end regions of the free magnetic layer 4 are aligned in the X direction (track width direction), magnetizations E and F in the end regions of the pinned magnetic layer 2 are aligned in the Y direction so that the relative angle between magnetizations A and B of the free magnetic layer 4 in the end regions and magnetizations E and F of the pinned magnetic layer 2 are set at 90°.

As described above, in accordance with the present invention, with respect to the pinned magnetic layer, the magnetization in end regions in relation to the track width and the magnetization in the central region are adjusted to different directions so that the relative angle between the magnetization of the free magnetic layer and the magnetization of the pinned magnetic layer is set at 90° or its approximation in the entire region, and thus, satisfactory asymmetry can be obtained and a servo error and the like can be prevented.

In the method for making a spin-valve type thin film element of the present invention, first, magnetic annealing is performed at the temperature T1, the magnetization H of the pinned magnetic layer 2 is adjusted to the direction inclined by $\theta$ in the X direction in relation to the Y direction, as shown in FIG. 2A.

After hard magnetic bias layers 5 and 5 are magnetized in the Y direction at a room temperature that is lower than the temperature T1 (refer to FIG. 2B), annealing is performed without applying a magnetic field at the temperature T2 so that magnetizations E and F of the pinned magnetic layer 2 in the end regions are set in the Y direction by ferromagnetic coupling between the hard magnetic bias layer 5 and the pinned magnetic layer 2 (refer to FIG. 2C).

As shown in FIG. 2C, since the central region of the pinned magnetic layer 2 is not strongly influenced by the coupled field between the hard magnetic bias layer 5 and the pinned magnetic layer 2, the magnetization G in the central region is put into a single domain state and fixed in the originally magnetized direction, that is, the direction inclined by $\theta$ in the X direction in relation to the Y direction.

After the magnetization of the pinned magnetic layer 2 is fixed in the proper direction as described above, when the hard magnetic bias layers 5 and 5 are magnetized in the X direction, as shown in FIG. 3A, magnetizations A and B of the free magnetic layer 4 in the end regions are adjusted to the track width direction (X direction), and magnetizations C1, C2, and C3 of the free magnetic layer 4 in the central region repulse the magnetization of the pinned magnetic layer 2 owing to static magnetic coupling between the pinned magnetic layer 2 and the free magnetic layer 4, and are inclined as shown in the drawing.

When a sensing current is applied, as shown in FIG. 3B, magnetizations C1, C2, and C3 of the free magnetic layer 4 in the central region are inclined by $\theta$ in relation to the X direction, and the relative angle between the magnetization of the free magnetic layer 4 and the magnetization of the pinned magnetic layer 2 is set at substantially 90° in the entire region.

DESCRIPTION OF THE PREFERRED EMBODIMENTS

Figure 1:
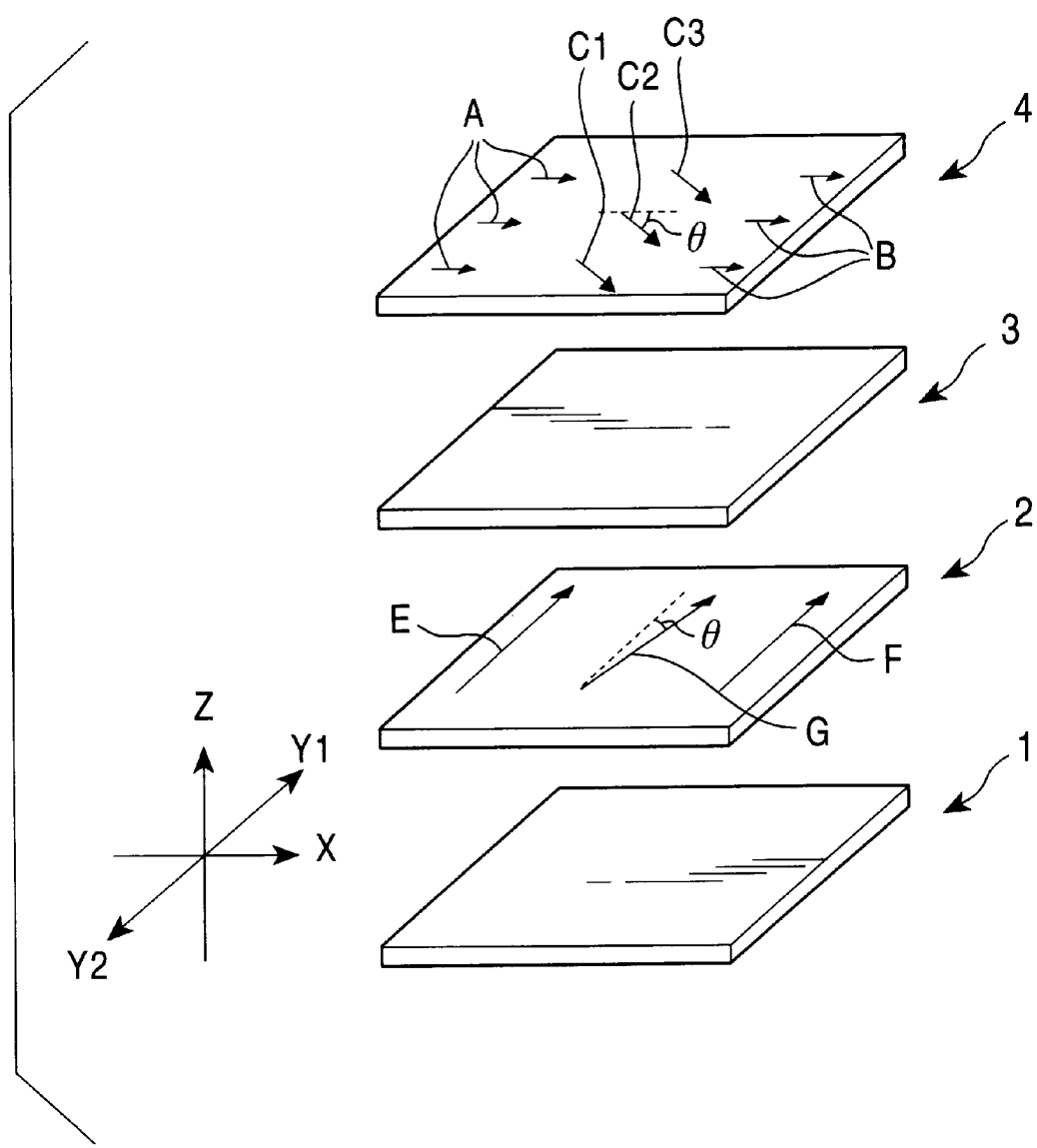
FIG. 1 is a partial schematic diagram of a spin-valve type thin film element as an embodiment of the present invention.

FIG. 1 is a schematic diagram showing the film structure and magnetization directions of a spin-valve type thin film element as an embodiment of the present invention. Magnetization directions shown in FIG. 1 are in the state when a sensing current is applied.

Figure 4:
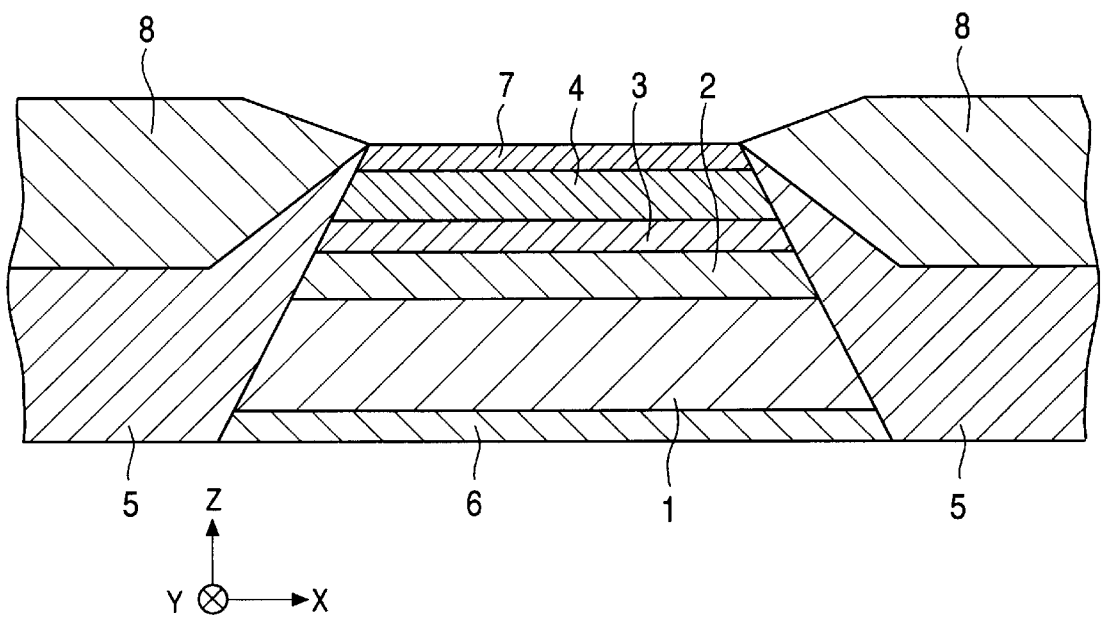
FIG. 4 is a sectional view showing a structure of a spin-valve type thin film element as a first embodiment of the present invention.

The actual shape of the spin-valve type thin film element shown in FIG. 1 will be described with reference to FIG. 4. FIG. 4 is a sectional view taken from the side of the air bearing surface (ABS), showing a structure of a spin-valve type thin film element as a first embodiment of the present invention.

The spin-valve type thin film element shown in FIG. 1 is mounted, for example, on the trailing edge of a levitated slider in a hard disk drive for detecting a recording magnetic field of a hard disk drive or the like. A magnetic recording medium such as a hard disk drive moves in the Z direction while a leakage magnetic field from the magnetic recording medium is directed in the Y1 direction. The X direction corresponds to the track width direction.

A pinned magnetic layer 2 is deposited on an antiferromagnetic layer 1. The antiferromagnetic layer 1 and the pinned magnetic layer 2 under deposition are annealed in a magnetic field having a given dimension, and thus, an exchange anisotropic magnetic field is obtained in the interface between both layers, and the magnetization direction of the pinned magnetic layer 2 is put into a single domain state and fixed in the proper direction.

In accordance with the present invention, the antiferromagnetic layer 1 is composed of an antiferromagnetic material having a composition of $X_a Mn_{100-a}$, where X is at least one element selected from the group consisting of Pd, Pt, Ru, and Ir. The atomic percent "a" preferably satisfies $40 \leq a \leq 60$.

The atomic percent "a" is set at a range from 40 to 60 atomic percent because within this range a large exchange anisotropic magnetic field can be obtained in the interface between the antiferromagnetic layer 1 and the pinned magnetic layer 2, and thereby the magnetization of the pinned magnetic layer 2 can be strongly fixed in the proper direction.

When the antiferromagnetic layer 1 is composed of the X—Mn alloy film, as described above, magnetic annealing must be performed to the antiferromagnetic layer 1 and the pinned magnetic layer 2 under deposition in order to obtain the exchange anisotropic magnetic field in the interface between the antiferromagnetic layer 1 and the pinned magnetic layer 2. The reason is that the crystal structure of the antiferromagnetic layer 1 after the deposition (before annealing treatment) mainly has a disorder phase which exhibits paramagnetism instead of an order phase which exhibits antiferromagnetism. By magnetic annealing, the order phase increases and antiferromagnetism increases. Thereby, exchange coupling occurs in the interface between the antiferromagnetic layer 1 and the pinned magnetic layer 2, resulting in the exchange anisotropic magnetic field.

Also, in accordance with the present invention, among X—Mn alloys, where X is at least one element selected from the group consisting of Pd, Pt, Ru, and Ir, in particular, a platinum-manganese (Pt—Mn) alloy is preferably used. The Pt—Mn alloy has higher thermal resistance, a higher blocking temperature, and also produces a larger exchange anisotropic magnetic field in comparison with the Ni—Mn alloy or the like that has been conventionally used for the antiferromagnetic layer. These are excellent characteristics as the antiferromagnetic material.

Also, the antiferromagnetic layer 1 may be composed of a Pt—Mn—X' alloy, where X' is at least one element selected from the group consisting of Ni, Pd, Rh, Ru, Ir, Cr, and Co.

The pinned magnetic layer 2 is composed of a nickel—iron (Ni—Fe) alloy, a cobalt—iron (Co—Fe) alloy, a Co—Fe—Ni alloy, or Co.

As shown in FIG. 1, magnetizations E and F of the pinned magnetic layer 2 in the end regions in relation to the X direction (track width) are put into a single domain state and fixed in the Y1 direction. On the other hand, the magnetization G in the central region is put into a single domain state and fixed in the direction inclined by θ in the X direction in relation to the Y1 direction.

As described above, in accordance with the present invention, there is a difference in magnetization direction between the end regions and the central region of the pinned magnetic layer 2 so that the relative angle between the magnetization of the pinned magnetic layer 2 and the magnetization of the free magnetic layer 4 is set at 90° or its approximation in the entire region. The method for fixing the magnetization of the pinned magnetic layer 2 in different directions with respect to the end regions and the central region will be described below.

On the pinned magnetic layer 2, a non-magnetic electrically conductive layer 3 composed of copper (Cu) having low electrical resistance is formed, and a free magnetic layer 4 is deposited thereon. The free magnetic layer 4 is composed of the same material as that for the pinned magnetic layer 2, i.e., an Ni—Fe alloy, a Co—Fe alloy, a Co—Fe—Ni alloy, or Co.

Also, in the spin-valve type thin film element shown in FIG. 1, similarly to the spin-valve type thin film element shown in FIG. 4, an under layer 6 composed of a non-magnetic material such as tantalum (Ta) is formed under the antiferromagnetic layer 1, and a protective layer 7 composed of tantalum or the like is deposited on the free magnetic layer 4.

In the spin-valve type thin film element shown in FIG. 1, after the six layers from the under layer 6 to the protective layer 7 are deposited, both sides are scraped off diagonally as shown in FIG. 4. Then, hard magnetic bias layers 5 and 5 are formed on both sides of the six layers, and electrically conductive layers 8 and 8 are formed on the hard magnetic bias layers 5 and 5.

The hard magnetic bias layers 5 and 5 are composed of a magnet of a cobalt—platinum (Co—Pt) alloy, a cobalt—chromium—platinum (Co—Cr—Pt) alloy, or the like. The electrically conductive layers 8 and 8 are composed of tungsten (W), copper (Cu), or the like.

Figure 5:
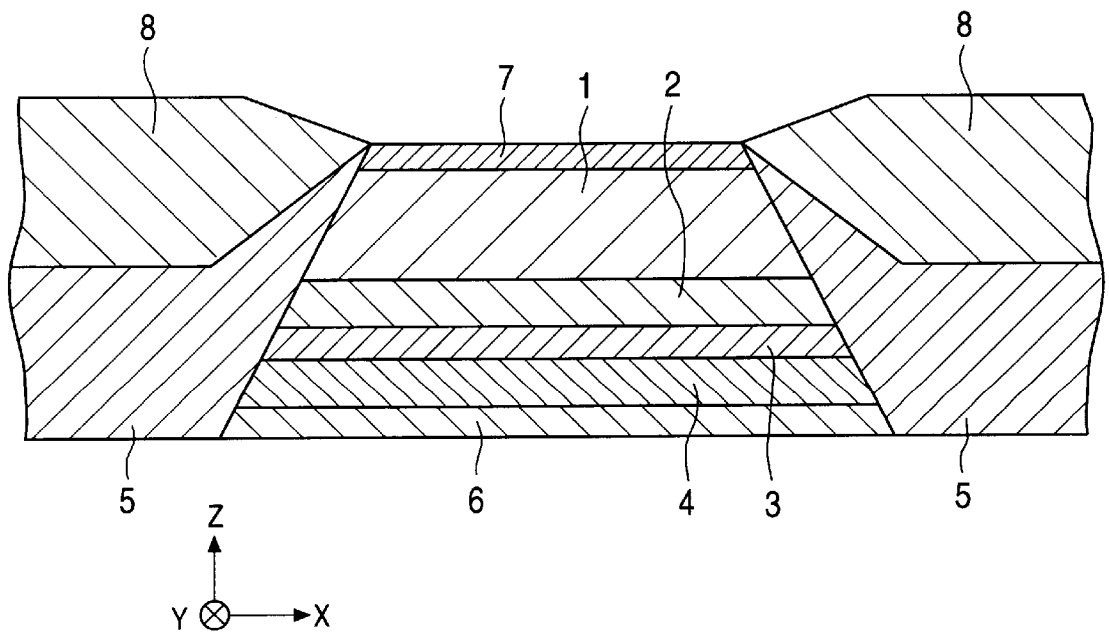
FIG. 5 is a sectional view showing a structure of a spin-valve type thin film element as a second embodiment of the present invention.

FIG. 5 is a sectional view taken from the side of the ABS, showing a structure of a spin-valve type thin film element as a second embodiment of the present invention.

The spin-valve type thin film element shown in FIG. 5 has the layers of the spin-valve type thin film element shown in FIG. 4 deposited in a reversed order. That is, in FIG. 5, on an under layer 6, a free magnetic layer 4, a non-magnetic electrically conductive layer 3, a pinned magnetic layer 2, and an antiferromagnetic layer 1 are deposited in that order.

Since the free magnetic layer 4 of the spin-valve type thin film element shown in FIG. 5 is formed below the antiferromagnetic layer 1, the free magnetic layer 4 abuts on the thick parts of the hard magnetic bias layers 5 and 5, and thereby, the bias magnetic field is easily applied into the free magnetic layer 4, and Barkhausen noise is easily suppressed.

The antiferromagnetic layer 1 shown in FIG. 5 is, the same as the antiferromagnetic layer 1 shown in FIG. 4, composed of a Pt—Mn alloy, an X—Mn alloy, or a Pt—Mn—X' alloy. If the Pt—Mn alloy, the X—Mn alloy, or the Pt—Mn—X' alloy is used as an antiferromagnetic material, an exchange anisotropic magnetic field can be produced in the interface whether the pinned magnetic layer 2 is formed on the antiferromagnetic layer 1 or under the antiferromagnetic layer 1.

Figure 6:
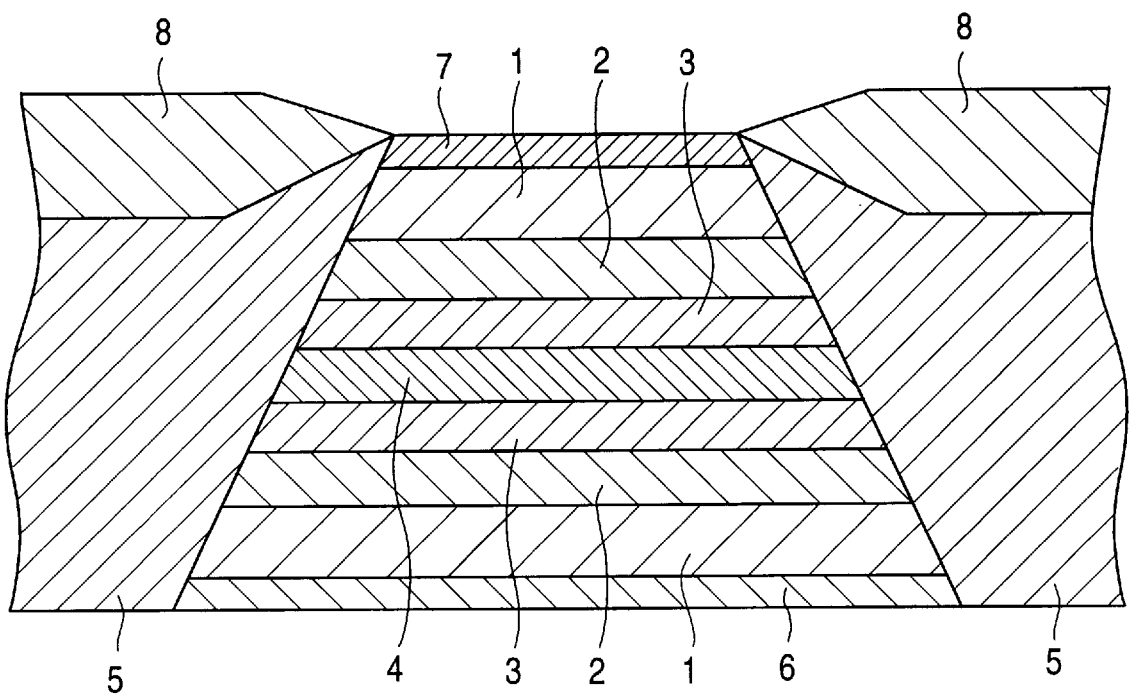
FIG. 6 is a sectional view showing a structure of a dual-spin-valve type thin film element as a third embodiment of the present invention.
Figure 7:
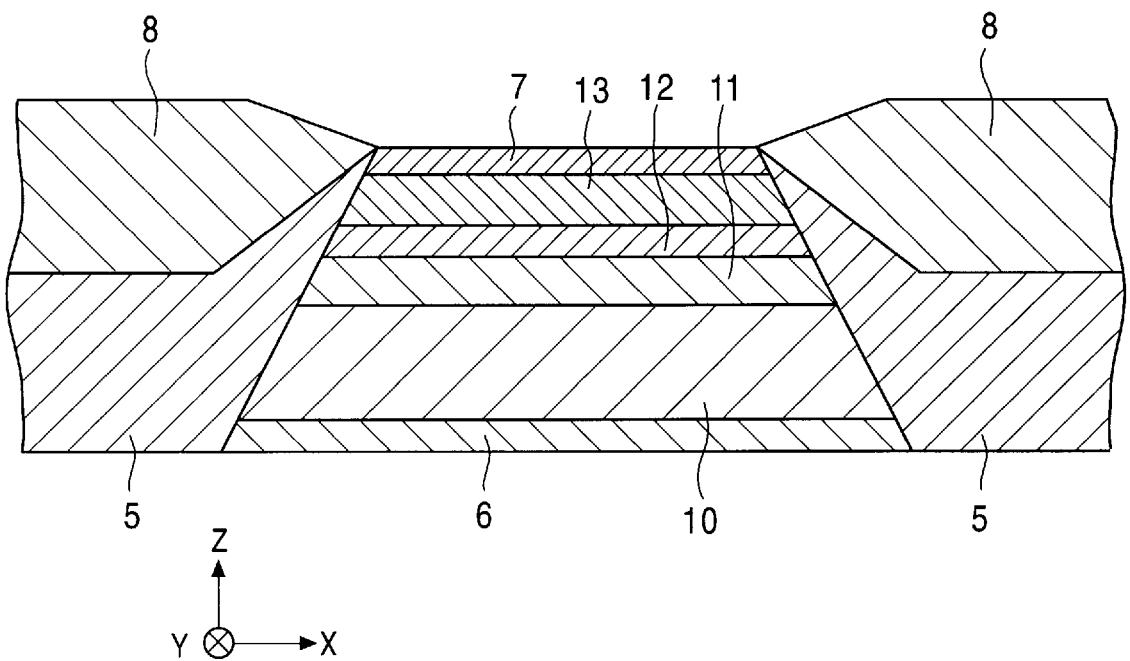
FIG. 7 is a sectional view showing a structure of a conventional spin-valve type thin film element.
Figure 8:
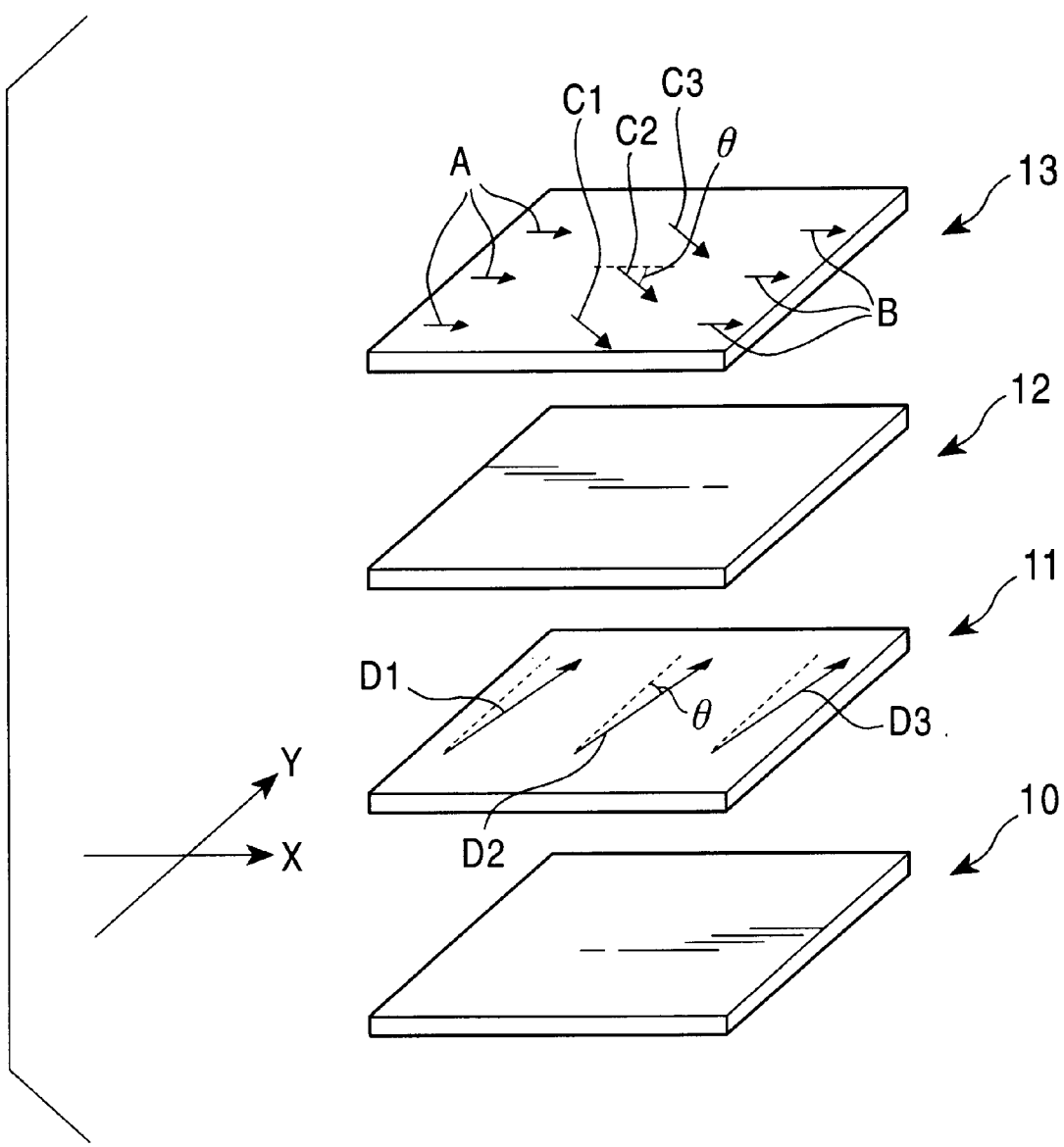
FIG. 8 is a first schematic diagram showing the film structure and magnetization directions of a conventional spin-valve type thin film element.
Figure 9:
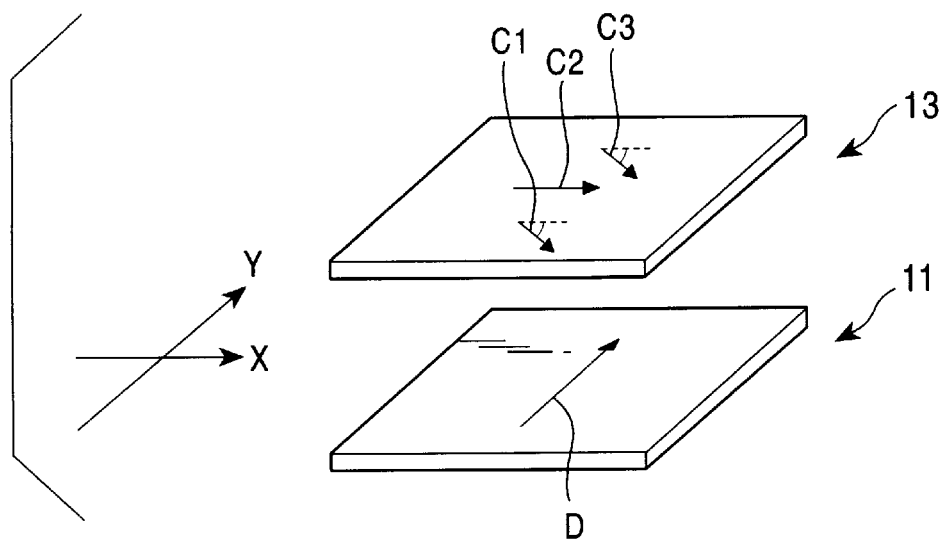
FIG. 9 is a second schematic diagram showing magnetization directions of the conventional spin-valve type thin film element.
Figure 10:
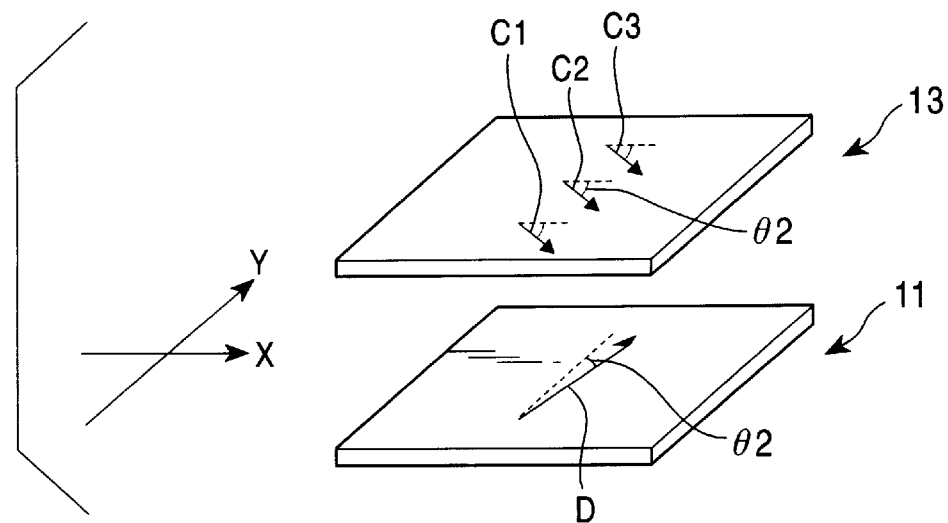
FIG. 10 is a third schematic diagram showing magnetization directions of the conventional spin-valve type thin film element.

FIG. 6 is a cross-sectional view of a dual-spin-valve type thin film element as a third embodiment of the present invention. As shown in FIG. 6, an underlying layer 6, an antiferromagnetic layer 1, a pinned magnetic layer 2, a non-magnetic electrically conductive layer 3, and a free magnetic layer 4 are continuously deposited in that order from the bottom. Further, a non-magnetic electrically conductive layer 3, a pinned magnetic layer 2, an antiferromagnetic layer 1 and a protective layer 7 are continuously deposited on the free magnetic layer 4, in that order. Hard biasing layers 5 and 5 and conductive layers 8 and 8 are deposited on the two sides of the multi-layered film composed of the underlying layer 6 through the protective layer 7. Each of these layers has the same composition as that in FIGS. 1 and 2.

The antiferromagnetic layers 1 and 1 is formed of a PtMn alloy, a X—Mn alloy, or a Pt—Mn—X' alloy as in the antiferromagnetic layer shown in FIGS. 4 and 5. The use of a PtMn alloy, a X—Mn alloy, or a Pt—Mn—X' alloy as an antiferromagnetic material enables the generation of an exchange coupling magnetic field at the interfaces between the antiferromagnetic layers 1 and 1 and the pinned magnetic layers formed above or under thereof.

The hard magnetic bias layers 5 and 5 are magnetized in the X direction, and under the influence of the hard magnetic bias layers 5 and 5, the magnetization of the free magnetic layer 4 is aligned in the X direction. However, in reality, only magnetizations A and B of the free magnetic layer 4 in the end regions in relation to the X direction (track width), which are most strongly influenced by the bias magnetic field from the hard magnetic bias layers 5 and 5, are aligned in the X direction as shown in FIG. 1. Magnetizations C1, C2, and C3 in the central region, which is least easily influenced by the bias magnetic field from the hard magnetic bias layers 5 and 5, are adjusted to the direction inclined by θ in the Y2 direction in relation to the X direction as shown in the drawing. Magnetizations C1, C2, and C3 in the central region are inclined because they are influenced by the static magnetic field between the free magnetic layer 4 and the pinned magnetic layer 2, the magnetic field caused by a sensing current, and the like.

In accordance with the present invention, as shown in FIG. 1, magnetizations C1, C2, and C3 of the free magnetic layer 4 in the central region are adjusted to the direction inclined by θ in the Y2 direction in relation to the X direction. On the other hand, the magnetization G in the central region of the pinned magnetic layer 2 is put into a single domain state and fixed in the direction inclined by θ in the X direction in relation to the Y1 direction. Therefore, in accordance with the present invention, the relative angle between magnetizations C1, C2, and C3 of the free magnetic layer 4 and the magnetization G of the pinned magnetic layer 2 in the central region is set substantially at 90°.

Furthermore, in accordance with the present invention, magnetizations A and B of the free magnetic layer 4 in the end regions are aligned in the X direction in the drawing, while magnetizations E and F of the pinned magnetic layer 2 in the end regions are fixed in the Y1 direction in the drawing. Therefore, in accordance with the present invention, in the end regions, the relative angle between magnetizations A and B of the free magnetic layer 4 and magnetizations E and F of the pinned magnetic layer 2 is set substantially at 90°.

As described above, in accordance with the present invention, the magnetization of the pinned magnetic layer 2 and the magnetization of the free magnetic layer 4 are perpendicular to each other in the entire region, and thus, satisfactory asymmetry can be obtained, and a servo error can be prevented.

In accordance with the present invention, preferably the magnetization gradually and continuously changes from the magnetization A to the magnetization C and from the magnetization C to the magnetization B of the free magnetic layer 4, and also, from the magnetization E to the magnetization G and the magnetization G to the magnetization F of the pinned magnetic layer 2.

In the spin-valve type thin film element shown in FIG. 1, when a sensing current is applied from the electrically conductive layer 8 (refer to FIGS. 4 and 5) into the pinned magnetic layer 2, the non-magnetic electrically conductive layer 3 and the free magnetic layer 4, and also, a magnetic field is applied from a recording medium in the Y1 direction, the magnetization C in the central region of the free magnetic layer 4 is adjusted to the direction of the magnetization G of the pinned magnetic layer 2, and the magnetizations A and B in the end regions of the free magnetic layer 4 are adjusted to the direction of the magnetizations E and F of the pinned magnetic layer 2. At this stage, the scattering state of conduction electrons in the interface between the non-magnetic electrically conductive layer 3 and the pinned magnetic layer 2 or in the interface between the non-magnetic electrically conductive layer 3 and the free magnetic layer 4 changes, and electrical resistance changes. Accordingly the sensing current changes, and an output can be detected.

Next, a method for making a spin-valve type thin film element in accordance with the present invention will be described with reference to FIGS. 2A through 2C and FIGS. 3A and 3B.

The single-spin-valve type thin film element shown in FIGS. 4 and 5 have two sites causing spin-dependent electron scattering at an interface between the non-magnetic electrically conductive layer 3 and the free magnetic layer 4 and at an interface between the non-magnetic conductive layer 3 and the pinned magnetic layer 2. In contrast, the dual-spin-valve type thin film element shown in FIG. 6 has four sites causing spin-dependent electron scattering at two interfaces between the non-magnetic electrically conductive layers 3 and the free magnetic layer 4 and at two interfaces between the non-magnetic electrically conductive layers 3 and the pinned magnetic layers 2. Thus, the dual-spin-valve type thin film element has a larger change in resistance than that of the single-spin-valve type thin film element.

First, as shown in FIG. 4, a multi-layered film is formed by depositing the antiferromagnetic layer 1, the pinned magnetic layer 2, the non-magnetic electrically conductive layer 3, and the free magnetic layer 4, in that order. Or, as shown in FIG. 5, a multi-layered film may be formed by depositing the free magnetic layer 4, the non-magnetic electrically conductive layer 3, the pinned magnetic layer 2, and the antiferromagnetic layer 1, in that order. Alternatively, a multi-layered film may be formed by depositing the antiferromagnetic layer 1, the pinned magnetic layer 2, the non-magnetic electrically conductive layer 3, the free magnetic layer 4, the non-magnetic electrically conductive layer 3, the pinned magnetic layer 2, and the antiferromagnetic layer 1, as shown in FIG. 6.

In accordance with the present invention, the antiferromagnetic layer 1 is composed of an X—Mn alloy (where X is at least one element selected from the group consisting of Pd, Pt, Ru, and Ir), and preferably composed of a Pt—Mn alloy. The composition of X preferably ranges from 40 to 60 atomic percent, and the balance corresponds to the composition of Mn.

Also, the antiferromagnetic layer 1 may be composed of a Pt—Mn—X' alloy (where X' is at least one element selected from the group consisting of Ni, Pd, Rh, Ru, Ir, Cr, and Co).

Since the antiferromagnetic layer 1 is composed of an X—Mn alloy film, the antiferromagnetic layer 1 after deposition (before annealing treatment) has paramagnetism, and thereby, an exchange anisotropic magnetic field is not produced in the interface between the antiferromagnetic layer 1 and the pinned magnetic layer 2, and the magnetization of the pinned magnetic layer 2 is not aligned in a given direction.

Figure 2A:
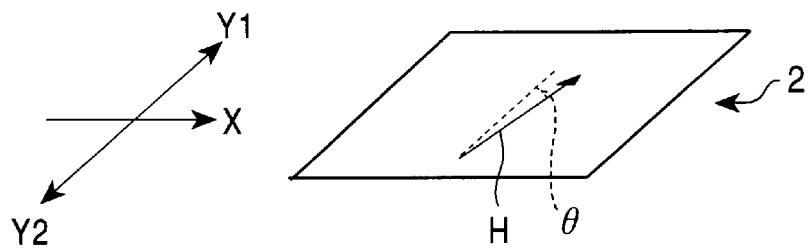
FIGS. 2A through 2C are schematic diagrams showing changes in the magnetization directions of a pinned magnetic layer, a free magnetic layer, and a hard magnetic bias layer which constitute the spin-valve type thin film element, in accordance with the manufacturing steps of the present invention.

Next, by magnetic annealing at a temperature T1, an exchange anisotropic magnetic field occurs in the interface between the antiferromagnetic layer 1 and the pinned magnetic layer 2, and, as shown in FIG. 2A, the magnetization H of the pinned magnetic layer 2 is put into a single domain state and fixed in the direction inclined by θ in the X direction in relation to the Y1 direction.

The temperature T1 used in this step is below the Neel point in the complete ordering state, and preferably is not very high, and, specifically, the temperature T1 preferably ranges from 200° C. to 260° C.

By annealing at a temperature T1 that is not very high, an interdiffusion layer formed between the antiferromagnetic layer 1 and the pinned magnetic layer 2 is thin, and an exchange anisotropic magnetic field produced between the antiferromagnetic layer 1 and the pinned magnetic layer 2 is relatively small. Thereby, the magnetization H of the pinned magnetic layer 2 shown in FIG. 2A, is relatively weakly put into a single domain state and fixed in the direction shown in the drawing.

Next, patterning is performed to the multi-layered film including the antiferromagnetic layer 1, the pinned magnetic layer 2, the non-magnetic electrically conductive layer 3, and the free magnetic layer 4, both sides are scraped off diagonally, and then, as shown in FIG. 4 (or FIG. 5), hard magnetic bias layers 5 and 5 are formed on both sides of the multi-layered film.

Figure 2B:
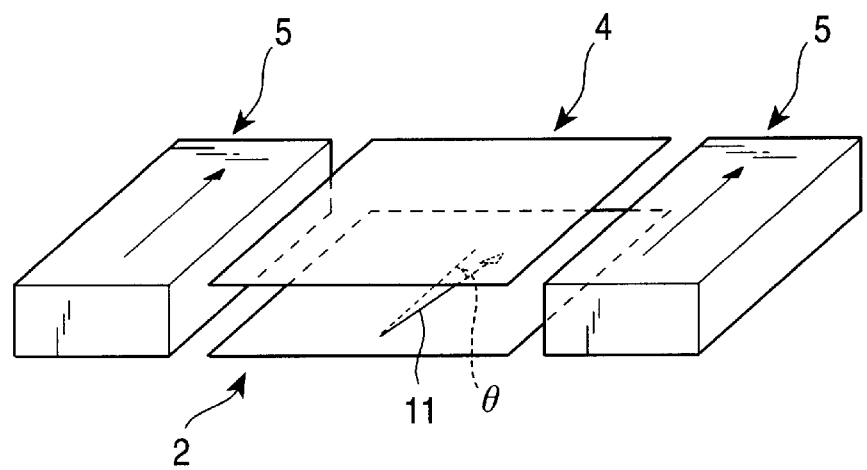

The hard magnetic bias layers 5 and 5 are magnetized in the Y1 direction as shown in FIG. 2B at a room temperature that is lower than the temperature T1. In this step, since the hard magnetic bias layers 5 and 5 are magnetized at room temperature, the exchange anisotropic magnetic field between the antiferromagnetic layer 1 and the pinned magnetic layer 2 is not influenced by the bias magnetic field from the hard magnetic bias layers 5 and 5. Thereby, the direction of the magnetization H of the pinned magnetic layer 2 remains the same as that shown in FIG. 2A.

Next, annealing is performed at a temperature T2. The temperature T2 used in this step is below the Neel point in the complete ordering state, and preferably is higher than the temperature T1, and, specifically, the temperature T2 preferably ranges from 210° C. to 270° C.

Figure 2C:
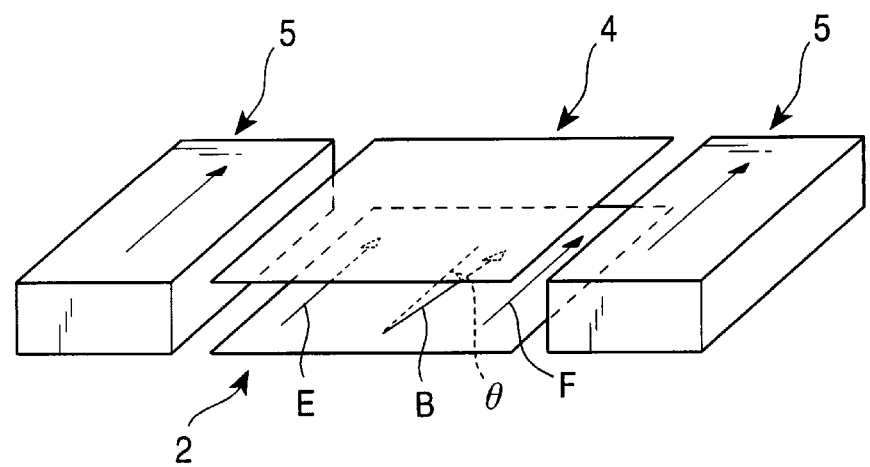

As shown in FIG. 2C, when annealing is performed at the temperature T2, magnetizations E and F of the pinned magnetic layer 2 in the end regions in relation to the X direction (track width) change from the direction of the magnetization H shown in FIGS. 2A and 2B (the direction inclined by θ in the X direction in relation to the Y1 direction) to the Y1 direction.

When annealing is performed at the temperature T2 (without applying a magnetic field), magnetizations E and F of the pinned magnetic layer 2 are set in the Y1 direction which is the same as that of the magnetization of the hard magnetic bias layers 5 and 5 owing to ferromagnetic coupling between the end regions of the pinned magnetic layer 2 and the hard magnetic bias layers 5 and 5. Thus, the direction of the exchange anisotropic magnetic field between the antiferromagnetic layer 1 and the pinned magnetic layer 2 in the end regions is adjusted to the Y1 direction, and magnetizations E and F in the end regions of the pinned magnetic layer 2 are put into a single domain state and fixed in the Y1 direction.

The magnetization G in the central region of the pinned magnetic layer 2 which is distant from the hard magnetic bias layers 5 and 5 is put into a single domain state and fixed in the direction inclined by θ in the X direction in relation to the Y1 direction, the same as that of the magnetization H shown in FIGS. 2A and 2B, because it is not strongly influenced by the coupled magnetic field between the pinned magnetic layer 2 and the hard magnetic bias layers 5 and 5.

In this step, annealing is performed without applying a magnetic field. If a magnetic field is applied, the magnetization of the entire region of the pinned magnetic layer 2 is directed in the direction of the magnetic field, and thereby, the magnetization G in the central region and magnetizations E and F in the end regions cannot be directed differently.

Also, as described above, since the temperature T2 is higher than the temperature T1, the X—Mn alloy as the antiferromagnetic layer 1 further transforms the crystal structure into the order phase, and thus, a larger exchange anisotropic magnetic field can be obtained, and magnetizations E, F, and G of the pinned magnetic layer 2 shown in FIG. 2C are strongly put into a single domain state and fixed in given directions.

Also, annealing at a temperature T2 that is higher than the temperature T1 increases the blocking temperature, and even if the spin-valve type thin film element is operated at high temperatures, the exchange anisotropic magnetic field between the antiferromagnetic layer 1 and the pinned magnetic layer 2 does not disappear, and thereby, the magnetization direction of the pinned magnetic layer 2 can be kept in the proper direction at high temperatures.

Figure 3A:
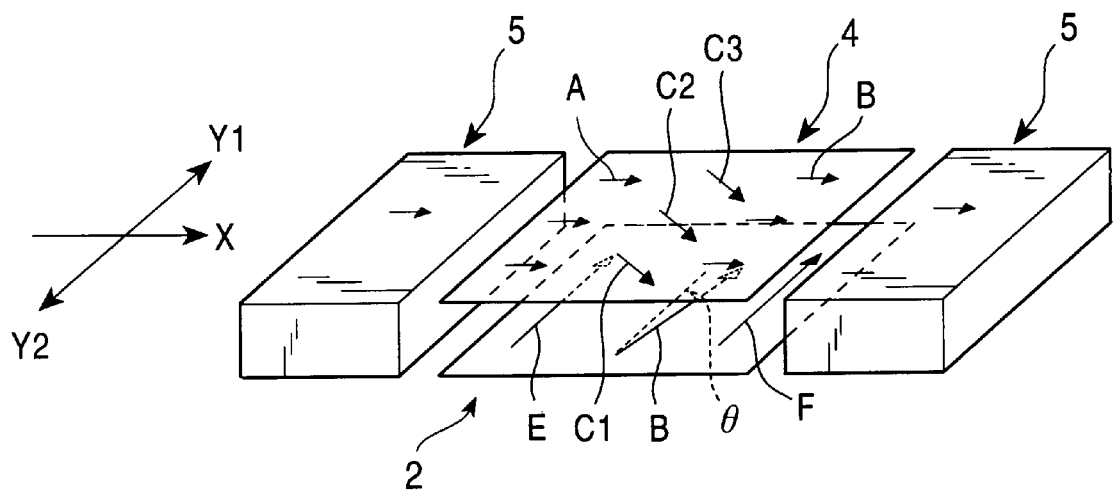
FIGS. 3A and 3B are schematic diagrams showing changes in the magnetization directions of the pinned magnetic layer, the free magnetic layer, and the hard magnetic bias layer which constitute the spin-valve type thin film element, in accordance with the manufacturing steps of the present invention.

Next, as shown in FIG. 3A, the hard magnetic bias layers 5 and 5 are magnetized in the X direction at a room temperature that is lower than the temperature T2. Thereby, magnetizations A and B in the end regions of the free magnetic layer 4 are aligned in the direction which is close to the X direction in the drawing.

Also, as shown in FIG. 3A, magnetizations C1, C2, and C3 of the free magnetic layer 4 in the central region are adjusted to the direction inclined in the Y2 direction in relation to the X direction. The reason for this is that because of static magnetic coupling between the free magnetic layer 4 and the pinned magnetic layer 2, magnetizations C1, C2, and C3 are subjected to an action of turning opposed to the magnetization direction of the pinned magnetic layer 2, which makes the direction of magnetizations C1, C2, and C3 inclined in the Y2 direction in relation to the X direction.

Figure 3B:
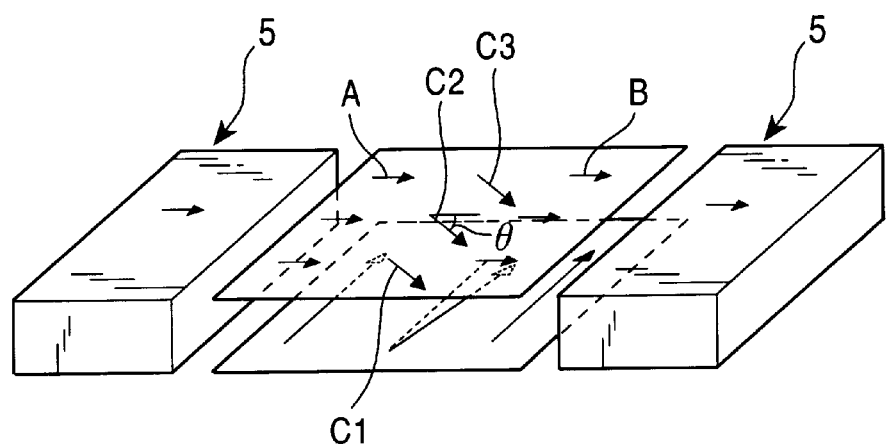

When a sensing current is applied into the pinned magnetic layer 2, the non-magnetic electrically conductive layer 3, and the free magnetic layer 4 in the direction opposite to the X direction, magnetizations C1, C2, and C3 of the free magnetic layer 4 in the central region are inclined in the X direction under the influence of the magnetic field produced by the sensing current, and adjusted to the direction inclined by θ in the Y2 direction in relation to the X direction (refer to FIG. 3B). Magnetizations A and B in the end regions of the free magnetic layer 4 are more strongly influenced by the hard magnetic bias layers 5 and 5 than by the magnetic field produced by the sensing current, and thus, are adjusted to the X direction.

The magnetization C in the central region of the free magnetic layer 4 is easily influenced by the magnetic field produced by static magnetic coupling and the magnetic field produced by the sensing current because the central region of the free magnetic layer 4 is distant from the hard magnetic bias layers 5 and 5 and is not strongly influenced by the hard magnetic bias layers 5 and 5.

In accordance with the method for making a spin-valve type thin film element of the present invention, the magnetization G in the central region of the pinned magnetic layer 2 can be fixed in the direction inclined by θ in the X direction in relation to the Y1 direction, and magnetizations E and F in the end regions of the pinned magnetic layer 2 can be fixed in the Y1 direction.

Accordingly, when a sensing current is applied, the relative angle between the magnetization C of the free magnetic layer 4 and the magnetization G of the pinned magnetic layer 2 in the central region can be set at 90°, and the relative angle between magnetizations A and B of the free magnetic layer 4 and magnetizations E and F of the pinned magnetic layer 2 in the end regions can be set at 90°. Consequently, the relative angle between the magnetization of the free magnetic layer 4 and the magnetization of the pinned magnetic layer 2 in the entire region can be set at 90°, and thus, satisfactory asymmetry can be obtained.

As described above, in accordance with the present invention, since the magnetization in the central region of the pinned magnetic layer is fixed in the direction inclined in relation to the direction of the leakage magnetic field from the recording medium, and the magnetization in the end regions of the pinned magnetic layer is fixed in the same direction as that of the leakage magnetic field from the recording medium, with a sensing current being applied, the relative angle between the magnetization of the free magnetic layer and the magnetization of the pinned magnetic layer in the entire region can be set at 90°, and thus, satisfactory asymmetry can be obtained and a servo error can be prevented.

Also, in accordance with the present invention, by using an X—Mn alloy (where X is at least one element selected from the group consisting of Pd, Pt, Ru, and Ir) and preferably a Pt—Mn alloy for the antiferromagnetic layer, a stronger exchange anisotropic magnetic field can be obtained, and a high blocking temperature can be obtained. Thereby, the magnetization of the pinned magnetic layer can always be fixed in the proper direction. Also, a Pt—Mn—X' alloy (where X' is at least one element selected from the group consisting of Ni, Pd, Rh, Ru, Ir, Cr, and Co) may be used for the antiferromagnetic layer.

Also, in accordance with the present invention, by performing the first annealing treatment at the temperature T1 in a magnetic field, the magnetization of the pinned magnetic layer is fixed in the direction inclined in relation to the direction of the leakage magnetic field from the recording medium, and after the hard magnetic bias layer is magnetized in the direction of the leakage magnetic field at room temperature, by performing the second annealing treatment at the temperature T2 without applying a magnetic field, the magnetization in the end regions of the pinned magnetic layer can be adjusted to the direction of the leakage magnetic field from the recording medium. By performing two steps of annealing treatment as described above, the magnetization in the end regions of the free magnetic layer can be fixed in the direction of the leakage magnetic field from the recording medium, and the magnetization in the central region of the free magnetic layer can be fixed in the direction inclined in relation to the direction of the leakage magnetic field from the recording medium.

The temperature T2 is preferably higher than the temperature T1. By setting the temperature T1 low, magnetic annealing at the temperature T1 can fix the magnetization of the pinned magnetic layer weakly in the direction inclined in relation to the direction of the leakage magnetic field from the recording medium. By weakly fixing the magnetization of the pinned magnetic layer, when annealing is performed at the temperature T2, ferromagnetic coupling is caused between the pinned magnetic layer and the hard magnetic bias layer, enabling the adjustment of the magnetization in the end regions of the pinned magnetic layer to the magnetization direction of the leakage magnetic field from the recording medium. Also, by setting the temperature T2 high, a large exchange anisotropic magnetic field can be produced in the interface between the pinned magnetic layer and the antiferromagnetic layer, and thus, the magnetization in the central region of the pinned magnetic layer and the magnetization in the end regions of the pinned magnetic layer can be strongly fixed in the direction inclined in relation to the magnetization direction of the leakage magnetic field from the recording medium and in the same direction as that of the leakage magnetic field from the recording medium, respectively.

Also, by setting the temperature T2 high, the blocking temperature increases, and if the spin-valve type thin film element is operated at high temperatures, the magnetization of the pinned magnetic layer can be maintained in the proper direction.

What is claimed is:

1. A spin-valve type thin film element comprising:
   an antiferromagnetic layer;
   a pinned magnetic layer formed in contact with said antiferromagnetic layer, the magnetization direction of said pinned magnetic layer being fixed by the exchange anisotropic magnetic field between said pinned magnetic layer and said antiferromagnetic layer;
   a free magnetic layer formed over and/or under said pinned magnetic layer with a non-magnetic electrically conductive layer therebetween;
   a bias layer for aligning the magnetization direction of said free magnetic layer in the direction perpendicular to the magnetization direction of said pinned magnetic layer; and
   an electrically conductive layer for applying a sensing current into said pinned magnetic layer, said non-magnetic electrically conductive layer, and said free magnetic layer,
   wherein, the magnetization direction of said pinned magnetic layer in the end regions in relation to the track width is fixed in the direction of the leakage magnetic field from a recording medium, and the magnetization direction of said pinned magnetic layer in the central region is fixed in the direction inclined in relation to the direction of the leakage magnetic field from the recording medium.

2. A spin-valve type thin film element according to claim 1, wherein the magnetization direction of said pinned magnetic layer in the central region is set perpendicular to the magnetization direction of the free magnetic layer in the central region when a sensing current is applied.

3. A spin-valve type thin film element according to claim 2, wherein said antiferromagnetic layer comprises an antiferromagnetic material having a composition of $X_a Mn_{100-a}$, where X is at least one element selected from the group consisting of Pd, Pt, Ru, and Ir, and the atomic percent "a" satisfies $40 \leq a \leq 60$.

4. A spin-valve type thin film element according to claim 3, wherein said antiferromagnetic layer comprises a Pt—Mn alloy.

5. A spin-valve type thin film element according to claim 2, wherein said antiferromagnetic layer comprises a Pt—Mn—X' alloy, where X' is at least one element selected from the group consisting of Ni, Pd, Rh, Ru, Ir, Cr, and Co.

6. A spin-valve type thin film element according to claim 1, wherein said antiferromagnetic layer comprises an antiferromagnetic material having a composition of $X_a Mn_{100-a}$, where X is at least one element selected from the group consisting of Pd, Pt, Ru, and Ir, and the atomic percent "a" satisfies $40 \leq a \leq 60$.

7. A spin-valve type thin film element according to claim 6, wherein said antiferromagnetic layer comprises a Pt—Mn alloy.

8. A spin-valve type thin film element according to claim 1, wherein said antiferromagnetic layer comprises a Pt—Mn—X' alloy, where X' is at least one element selected from the group consisting of Ni, Pd, Rh, Ru, Ir, Cr, and Co.

* * * * *

UNITED STATES PATENT AND TRADEMARK OFFICE
CERTIFICATE OF CORRECTION

PATENT NO.    : 6,178,071 B1                                        Page 1 of 1
DATED         : January 23, 2001
INVENTOR(S)   : Naoya Hasegawa et al.

It is certified that error appears in the above-identified patent and that said Letters Patent is hereby corrected as shown below:

<u>Title page,</u>
Under "U.S. PATENT DOCUMENTS",
Before line 1, insert the following:
-- 5,018,037   5/1991    Krounbi et al.
   5,079,035   1/1992    Krounbi et al.
   5,159,513   10/1992   Dieny et al.
   5,206,590   4/1993    Dieny et al. --.
After line 1, insert the following:
-- 5,373,238   12/1994   McGuire et al. --.

Under "FOREIGN PATENT DOCUMENTS", before line 1, insert the following:
-- 9092907A    4/1997    (JP). --.

Signed and Sealed this

Twenty-third Day of April, 2002

Attest:

Attesting Officer

JAMES E. ROGAN
Director of the United States Patent and Trademark Office